United States Patent [19]

Fujikawa et al.

[11] Patent Number: 5,269,490
[45] Date of Patent: Dec. 14, 1993

[54] SOLENOID VALVE MOUNTING ASSEMBLY

[75] Inventors: Atsushi Fujikawa; Yukio Morita; Tsunefumi Niiyama, all of Saitama; Takamichi Shimada, Tokyo, all of Japan

[73] Assignee: Honda Giken Kogyo Kabushiki Kaisha, Tokyo, Japan

[21] Appl. No.: 957,436

[22] Filed: Oct. 6, 1992

[30] Foreign Application Priority Data

Oct. 7, 1991 [JP] Japan ................................ 3-287017

[51] Int. Cl.⁵ .......................................... F16K 31/06
[52] U.S. Cl. ........................... 251/129.15; 251/129.14; 137/596.17; 137/884; 137/625.65
[58] Field of Search ............. 137/596.17, 884, 625.65, 137/560; 251/129.15, 129.14; 439/205, 206, 606, 722, 933, 936; 335/278

[56] References Cited

U.S. PATENT DOCUMENTS

| | | | |
|---|---|---|---|
| 3,588,039 | 6/1971 | Chelminski | 335/278 |
| 3,800,826 | 4/1974 | McCann | 137/560 |
| 3,856,260 | 12/1974 | Giordana | 137/625.65 |
| 4,568,026 | 2/1986 | Baun | 137/884 |
| 4,578,662 | 3/1986 | Slavin et al. | 137/625.65 |
| 4,785,848 | 11/1988 | Leiber | 137/884 |

Primary Examiner—Martin P. Schwadron
Attorney, Agent, or Firm—Lyon & Lyon

[57] ABSTRACT

The solenoid valve 30 is mounted on the mounting member 10 with the inlet port section 31 positioned at the lower end thereof extending out downwardly from the bottom face of the mounting member 10, and this mounting member 10 is mounted on the base member 1 to cover the supplied oil path 2 and the discharged oil path 3 formed in the base member 1. The inlet port section 31 of the solenoid valve 30 extending out from the bottom surface of the mounting member 10 extends into the supplied oil path 2, thus the inlet port 31a and the supplied oil path 2 are communicated to each other. Furthermore, the outlet port 31b of the solenoid valve 30 is communicated to the discharged oil path 3 via the communicating groove 12 formed on the bottom surface of the mounting member 10. Also, the electric connector 21 is mounted on the mounting member 10 and the wiring members 25, 26 and 27 connecting the solenoid 36 of the solenoid valve 30 to this electric connector 21 are buried inside the mounting member 10.

6 Claims, 3 Drawing Sheets

SOLENOID VALVE MOUNTING ASSEMBLY

BACKGROUND OF THE INVENTION

1. FIELD OF THE INVENTION

The present invention relates to the construction for an assembly for mounting a solenoid valve which is used for controlling operations of a speed change control valve or for other purposes in a vehicle transmission or other devices.

2. DESCRIPTION OF PRIOR ART

In the prior art, a solenoid valve is used for a speed change control valve in a vehicle transmission, and this type of solenoid valve is usually mounted on a housing of the transmission or on a housing of the speed change control valve (which are called "base member" hereinafter). In this case, the solenoid valve comprises a valve section which works as a hydraulic valve for switching oil paths and a solenoid section which generates a force to move a spool of this hydraulic valve, and various devices and propositions have been made for their configurations and constructions to mount them on a housing.

For instance, a construction wherein an oil path and a valve seat are mounted on a base board mounted on a base member and a valve body, a solenoid, and a magnetic tube are mounted on the base board is disclosed in Japanese Patent Publication No. 38468/1991.

Also, a construction wherein an undercover is mounted via a separator plate on a valve body (base member) and an oil path for a solenoid valve is formed on this under cover with a solenoid valve provided facing this oil path is disclosed in Japanese Patent Laid Open Publication No. 278068/1990.

In the conventional constructions for mounting a solenoid valve as described above, an oil path for a solenoid valve is generally winding and complicated, so it is difficult to form an oil path with a large cross-sectional area and resistance in the oil path is apt to become larger, which is a problem to be solved.

Also, in a case where a plurality of solenoid valves are to be provided, wiring is required for each solenoid, so the wiring is apt to become complicated, which will in turn result in a complicated wiring harness. It should be noted that a construction wherein a circuit board is provided on a member for mounting a solenoid valve to simplify the wiring is proposed in Japanese Patent Laid Open Publication No. 87491/1989. In this case, however, a separate circuit board is required, which results in an increase of parts as well as increase of its cost.

In addition, in the prior art, it is required to directly mount the solenoid valve on the base member, so that operating sounds and vibrations generated by the solenoid valve are directly delivered to the base member, which often generates noises.

SUMMARY OF THE INVENTION

An object of the present invention is to provide a construction for mounting a solenoid valve wherein an oil path for the solenoid valve can easily be formed.

Another object of the present invention is to provide a construction for mounting a solenoid valve wherein wiring for the solenoid can be simplified and connection of the wiring can easily be done.

A further object of the present invention is to provide a construction for mounting a solenoid valve wherein the electric insulation in the solenoid driving section can be effected without fail and noises generated therein can be reduced by suppressing transmission of operational sounds of the solenoid valve.

To achieve the objects as described above, in the present invention, a solenoid valve is mounted on a mounting member so that an inlet port member at a lower end of the solenoid valve extends downwardly from a bottom surface of the mounting member, and the mounting member is mounted on a base member so that said mounting member covers a supplied oil path and a discharged oil path formed in the base member. When mounted, the inlet port member of the solenoid valve extending out from the bottom surface of the mounting member goes into the supplied oil path and the inlet port and the supplied oil path are communicated with each other. Furthermore, an outlet port of the solenoid valve is communicated to the discharged oil path via a communicating groove formed o the bottom surface of the mounting member. Also, an electric connector is mounted on the mounting member, and at the same time a wiring member connecting the solenoid of the solenoid valve to this electric connector is buried in the mounting member.

In the construction as described above, it is preferable to form the mounting member with an insulating resinous material and also to monolithically incorporate and bury the wiring members when forming the mounting member. In this case, it is preferable to provide a plug terminal extending to the outside on the solenoid valve so that the plug terminal is inserted into an inserting hole arranged on the mounting member when the solenoid valve is mounted on the mounting member and is electrically connected to the aforesaid wiring members buried in the mounting member by physically contacting the latter. By employing the construction for mounting a solenoid valve built as described above, an inlet port section of the solenoid valve is inserted into a supplied oil path of a base member and these two ports are communicated, so that construction of an oil path in this section is quite easy. Furthermore, because of this construction, an oil path communicating an outlet port of a solenoid valve to a discharged oil path to the base member can be formed with a groove arranged on the bottom face of the mounting member, so that also it is quite easy to construct this oil path.

Also, by forming a mounting member with an insulating resinous material (such as polycarbonate, or epoxy acrylate resin), it is possible to form the mounting member, monolithically incorporating the wiring members therein simultaneously when forming the mounting member. With this, the wiring members is positioned inside the mounting member, and the wiring is not exposed to outside, so that the wiring construction can be simplified. It should be noted that by forming a mounting member with the resinous material as described above the operating sound generated by the solenoid is absorbed by the mounting member and transmission of the sound to the base member can be prevented. For this reason, transmission of operating sound of the solenoid to the outside is suppressed and problems concerning noises can be mitigated.

DETAILED DESCRIPTION OF THE PREFERRED EMBODIMENTS

Figure 1:
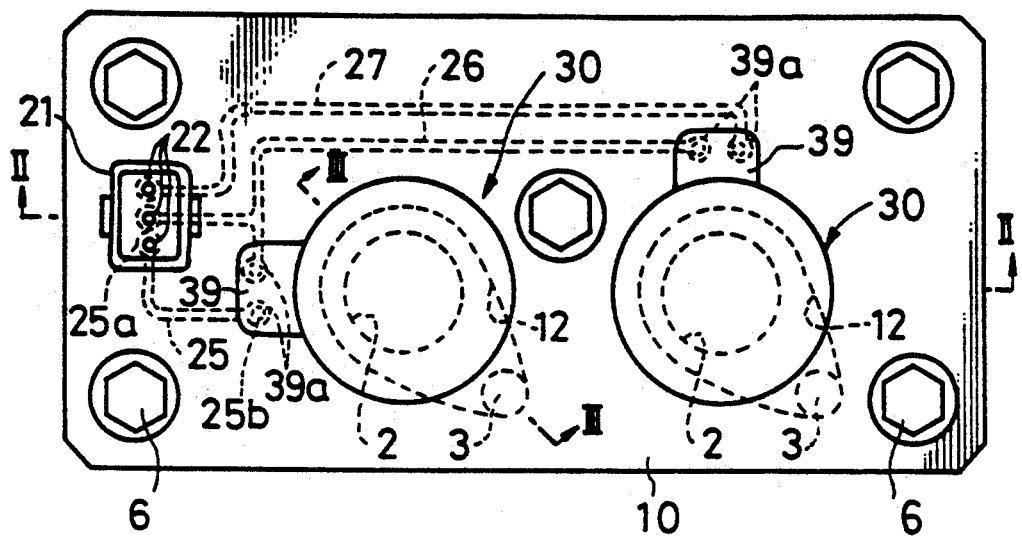
FIG. 1 is a top view showing two solenoid valves mounted on a base member by applying a mounting construction according to the present invention.
Figure 2:
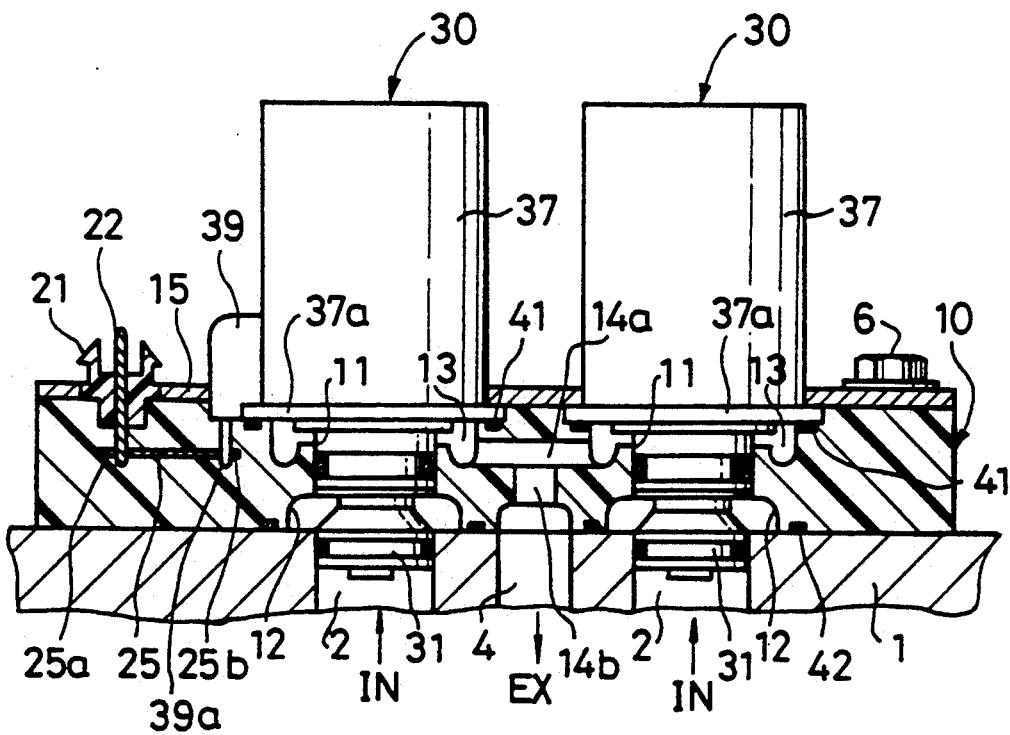
FIG. 2 is a cross section of the mounting member and base member with the aforesaid solenoid valves taken along the line II—II of FIG. 1.

One embodiment of a construction for mounting a solenoid valve according to the present invention is shown in FIG. 1 and FIG. 2. In this mounting construction, two solenoid valves 30 are mounted via a mounting member 10 on a base member 1. It should be noted that these two [pieces of] solenoid valves 30 have the same construction.

The base member 1 is, for instance, a housing for a vehicle transmission or a speed change control valve body and a supplied oil path 2 and a discharged oil path 3, both for hydraulic oil, and a drained oil path 4 are formed in the base member 1 and through the top surface with the openings exposed to the outside.

A mounting member 10 is formed of an insulating resin such as polycarbonate, or epoxy acrylate, and has the form of approximately a rectangular plate. This mounting member 10 is mounted on the base member 1 so that the bottom surface contacts a top surface of the base member 1. On the bottom surface of the mounting member 10 are formed communicating cavities or grooves 12 each communicating the supplied oil path 2 and the discharged oil path 3 at two places, and furthermore solenoid valve inserting holes 11, each vertically penetrating the mounting member 10 through these communicating grooves 12, are formed at two places.

On the top surface of the mounting member 10 are formed drain grooves 13 each surrounding the solenoid valve inserting hole 11 at two places. The two drain grooves 13 are communicated to each other through a first drain hole 14a which is formed inside the mounting member 10, and the first drain hole 14a is communicated to a second drain hole 14b having an opening on the bottom surface of the mounting member 10. The second drain hole 14b faces the drained oil path 4 of the base member 1, and as a result both the drain grooves 13 are communicated to the drained oil path 4. It should be noted that the drained oil path of the mounting member comprises the drain groove 13, the first drain hole 14a, and the second drain hole 14b.

Inside of the mounting member 10 are provided three wiring members 25, 26 and 27 (the members each having a form as shown by broken lines in FIG. 1), each monolithically formed with and buried in the mounting member 10 when forming said mounting member 10. In one end section of the top surface of the mounting member 10 is provided an electric connector 21 having three contacts 22, and these contacts 22 are inserted into the mounting member 10 with the tips contacting and connected to ends of the wiring members 25, 26 and 27 respectively. Also, the other ends of these wiring members 25, 26 and 27 extend to a position facing a contact 39a of each solenoid valve 30, and when each solenoid valve is mounted on the mounting member 10, these ends contact and are connected to the contacts 39a.

In case of the wiring member 25, for instance, the one end 25a extends as far as just below the contact 22 of the electric connector 21. In this section is formed a contact inserting hole extending from the top surface of the mounting member 10 to one end 25a of the wiring member 25, and the end 25a is provided around the contact inserting hole. For this reason, when the electric connector 21 is mounted as shown in the figure, the contact 22 is press-fitted into the contact inserting hole, and a lower edge of the contact 22 contacts the one end 25a of the wiring member 25, thus both being electrically connected.

The other end 25b of the wiring member 25 extends as far as just below a contact 39a of the solenoid valve 30, and is provided around a contact inserting hole formed in this section. For this reason, when the solenoid valve is mounted as shown in the figure and the contact 39a is press-fitted into the contact inserting hole, a tip of the contact 39a contacts the other end 25b of the wiring member 25, thus both being electrically connected.

Figure 3:
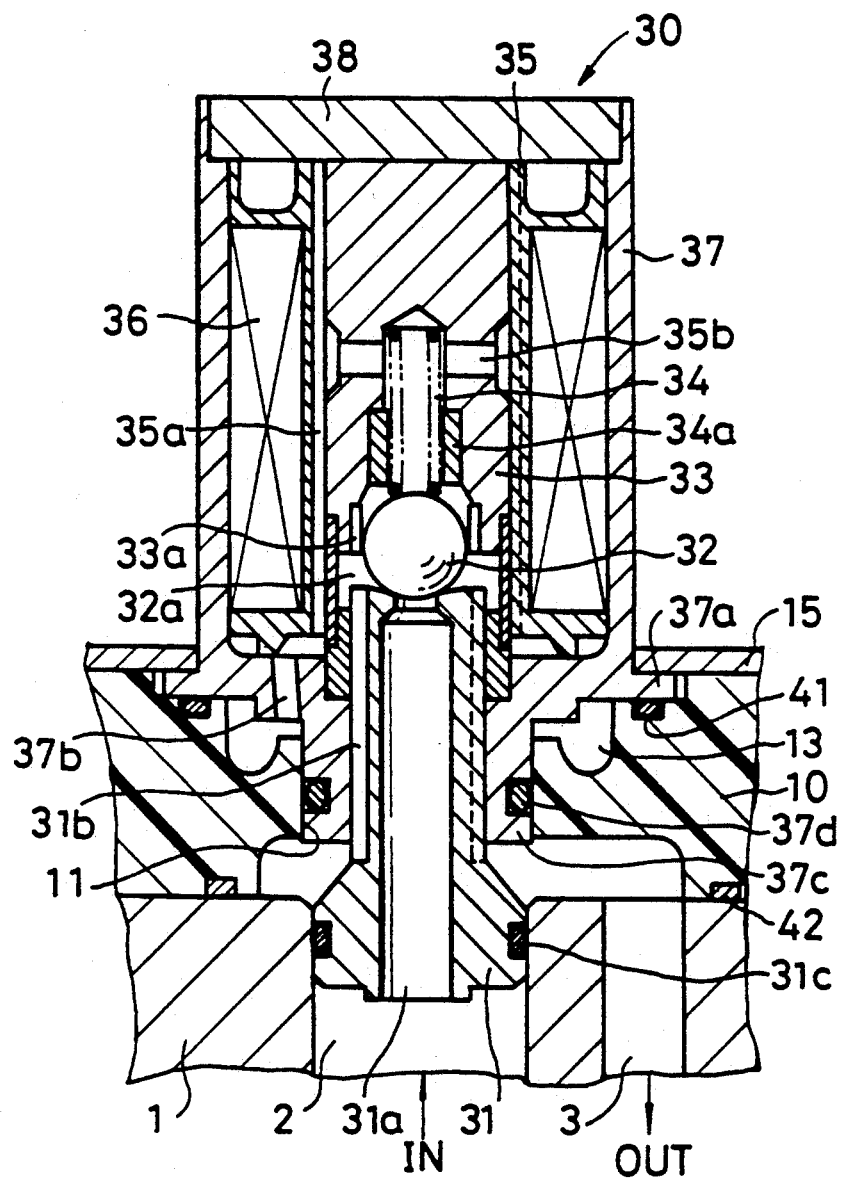
FIG. 3 is an enlarged cross section of one of the aforesaid solenoid valves taken along the line III—III of FIG. 1.

The solenoid valve 30 is mounted on the mounting member 10 with the lower section inserted into the solenoid valve inserting hole 11, and description is made below for construction of the solenoid valve 30 with reference to FIG. 3.

In this valve 30, a solenoid coil 36 is provided and supported by a supporting member 35 in a cylindrical case 37. A lower section 37c of the case 37 extends downward, and the lower section 37c is inserted into the solenoid valve inserting hole 11. It should be noted that an O-ring 37d to seal this inserted section is provided around the external peripheral surface of this lower section 37c. Also, when mounted on the mounting member 10, a flange section 37a of the case 37 covers the drain groove 13. An O-ring 41 is provided contacting the lower surface of this flange section 37a so that oil in the drain groove 13 will not leak out.

An inserting hole is vertically formed in the lower section 37c of the case 37, and the inlet port member 31 is mounted therein, being inserted into the inserting hole from the bottom. This inlet port member 31 extends downwardly further than the lower section 37c of the case, and a vertically extending inlet oil path 31a is formed at the center of the inlet port member 31. A plurality of vertically extending grooves 31b are formed on the external peripheral surface of the inlet port member 31, and the grooves form an vertically extending outlet oil path 31b which is located between the inserting hole in lower section 37c of the case and the inlet port member 31.

A ball supporting member 33 is provided within the supporting member 35, and a ball 32 is supported in a lower section of this ball supporting member 33 in a vertically movable manner. This ball 32 is urged downward by a spring 34 in the ball supporting member 33, and for this reason, in the ordinary state (in other words, when the solenoid coil is not excited), the ball 32 contacts the upper edge of the inlet port member 31 to block the upper edge of the inlet oil path 31a.

Between the lower edge of the ball supporting member 33 and the upper edge of the inlet port member 31 is formed an internal space 32a, and this internal space 32a communicates to the outlet oil path 31b. A plurality of grooves 33a are formed in a ball supporting hole of the ball supporting member 33, and when the ball 32 is moved by the spring 34 and is located at the position as shown in the figure, the internal space 32a communicates to a path 35b inside the ball supporting member 33 via the grooves 33a. This path 35b communicates to the drain groove 13 via a plurality of grooves 35a formed on the external peripheral surface of the ball supporting member 33 and a path 37b formed in the case 37.

The solenoid valve having the construction as described above is first mounted on the mounting member 10. The solenoid valve is mounted by inserting the lower section 37c of the case into the solenoid valve inserting hole 11, with a lower section of the inlet port section 31 extending downwardly from the bottom surface of the mounting member 10. It should be noted that a pair of contacts 39a extending downwardly from a contact supporting section 39 of each of the two solenoid valves 30 are press-fitted into a contact inserting hole of the mounting member 10, thus being connected to the other ends of the wiring members 25 and 26 or 26 and 27, as shown in FIG. 1. Also, a flange section 37a of the case 37 covers the drain groove 13, and this section is sealed by an O-ring 41.

Then, the mounting member 10 is mounted on the base member 1. During this operation, the inlet port member 31 extending downwardly from the bottom surface of the mounting member 10 is inserted into the supplied oil path 2, and is mounted as shown in the figure. This inserted section is sealed by the O-ring 31c provided on the external peripheral surface of the inlet port member 31 and, as shown in the figure, the supplied oil path 2 communicates to the inlet oil path 31a (inlet port of the inlet port member 31), while the communicating groove 12 communicates to the discharged oil path 3. The outlet oil path 31b (outlet port) communicates to this communicating groove 12, whereby the outlet oil path 31b communicates to the discharged oil path 3.

Then, the flange section 37a of the solenoid valve case 37 is held on the mounting member 10 by a holding plate 15 and the holding plate 15, the mounting member 10 and the solenoid valve 30 are fixed to the base member 1 with five bolts 6, thus completing the mounting of the solenoid valves.

Figure 4:
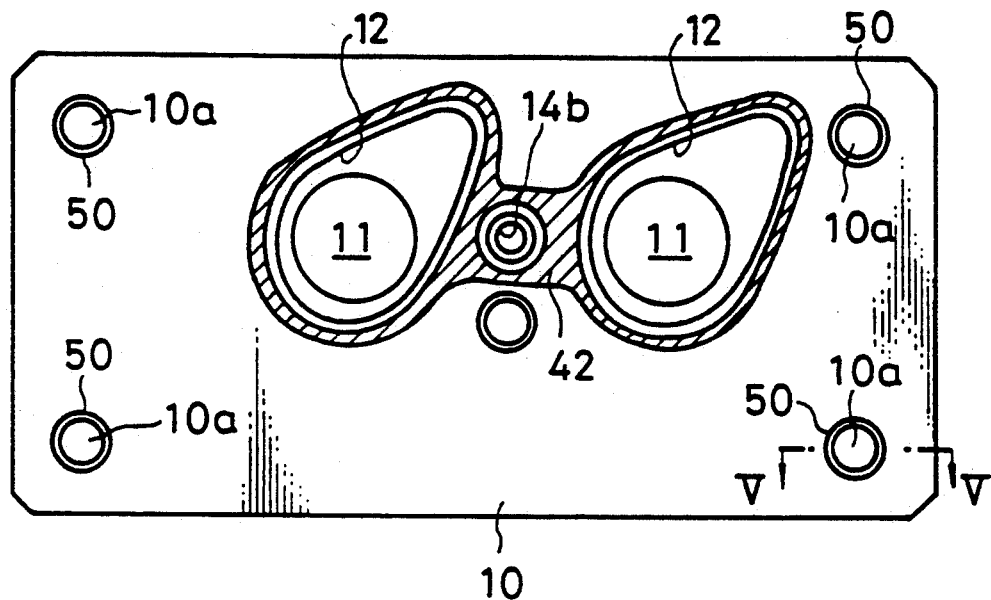
FIG. 4 is a bottom view showing the bottom surface of a mounting member constituting the mounting construction according to the present invention.
Figure 5:
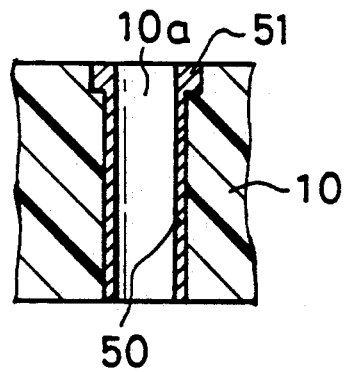
FIG. 5 is a fragmentary cross section of the aforesaid mounting member taken along the line V—V in FIG. 4.

It should be noted that a seal member mounting groove having a shape in the form of the cross-hatching shown in FIG. 4 on the bottom surface of the mounting member and a seal member 42 is mounted in this groove. This seal member 42 has a form for surrounding the openings of the two communicating grooves 12 and that of the second drain hole 14b (the form shown by cross-hatching in FIG. 4), and prevents oil leakage from the communicating grooves 12 and the second drain hole 14b to the outside.

Also for mounting with the bolts 6, five bolt inserting holes 10a, each vertically penetrating the mounting member 10, are formed in the mounting member 10, while screw holes for the bolts 6 to be screwed into are formed in the base member. It should be noted, however, that because the mounting member is formed of a resinous material, if the tightening force by the bolts 6 is applied directly, the mounting member 10 may be broken due to the tightening force. For this reason, a metallic cylindrical collar 50 (made of, for instance, steel) is press-fitted into each bolt inserting hole 10a. It should be noted that the collar 50 has a flange 51 that is positioned for press-fitting into a bore in the mounting member 10. When constructed in this manner, the tightening force by the bolt 6 is also received by the collar 50 so that an excessive force is not applied to the mounting member 10 and the mounting member is not damaged.

The operation of the solenoid valve will now be described.

Operations of each of the solenoid valves 30 are carried out according to control signals from wirings (harness) connected to the electric connector 21 by controlling excitation of the solenoid coil 36.

When the solenoid coil is not in the excited state, the ball 32 is pressed downward by the spring 34 and is set at an upper edge of the inlet port member 31, thus blocking the inlet oil path 31a. The outlet oil path 31b communicates via the groove 33a of the ball supporting member 33, path 35b and path 35a, and the path 37b of the case 37 to the drain groove 13. As a result, the supplied oil path 2 is blocked and at the same time the discharged oil path 3 is communicated to the drained oil path 4, thus a normal closed type of solenoid valve being constructed.

When the solenoid coil 36 is excited, a magnetic force generated by this coil causes the ball 32 to move upward. As a result, the ball 32 is moved upward against the spring 34 and is set on a seat member 34a of the ball supporting member 33, thereby opening the inlet oil path 31a and blocking the lower opening of the path 35b. In this condition, the inlet path 31a communicates via the internal space 32a to the outlet path 31b, and as a result the supplied oil path 2 is connected to the discharged oil path 3.

The above description assumes a three-way valve type of solenoid valve wherein communications between the inlet path, outlet path and drain path can be controlled by making use of excitation of the solenoid. It should be noted, however, that also a two-way valve type of solenoid valve for switching control between an inlet path and an outlet path can be used in this invention. In such case, a drain path is not necessary.

As described above, a solenoid valve is mounted on a mounting member so that an inlet port member at a lower end thereof extends downwardly from a bottom surface of the mounting member and, when this mounting member is mounted on a base member to cover a supplied oil path and a discharged oil path formed on the base member, the inlet port member of the solenoid valve extends into the supplied oil path, whereby the inlet port is communicated to the supplied oil path and the outlet port of the solenoid valve is communicated to the discharged oil path via a communicating groove formed on the bottom surface of the mounting member, so that the configuration of oil paths formed in the solenoid valve and the mounting member can be simplified, and also an oil path having a large enough cross section to insure stable flow of hydraulic oil can be formed.

In addition, an electric connector is mounted to this mounting member and a wiring member connecting a solenoid of a solenoid valve to this electric connector is buried in the mounting member, so that wiring to the solenoid can easily be carried out.

It should be noted that, in the construction as described above, by forming the mounting member with an insulating resinous material (such as polycarbonate or epoxy acrylate resin), it is possible to monolithically form with and incorporate a wiring member in the mounting member when forming said mounting member. With this feature, the wiring member is positioned inside the mounting member and the wiring is not exposed to the outside, so that the wiring construction can be simplified. Also it should be noted that, by forming the mounting member with a resinous material as described above, operating sound generated by the solenoid is absorbed by the mounting member to prevent this sound from being transmitted to the base member and also problems concerning noises can be mitigated by suppressing transmission of the operational sound of the solenoid to the outside.

What is claimed is:

1. A solenoid valve mounting assembly for mounting a solenoid valve on a base member having a supplied oil path and a discharged oil path, communications between those two oil paths being controlled by the solenoid valve, comprising, a mounting member molded of an insulating material and mounted on said base member to cover said supplied oil path and said discharged oil path, the solenoid valve being mounted on said mounting member and having an inlet port member extending through an opening in said mounting member, said inlet port member extending into said supplied oil path and having an inlet port communicating with said supplied oil path, the solenoid valve having an outlet port communicating with said discharged oil path via a communicating groove formed on a bottom face of said mounting member, and an electric connector mounted on said mounting member, and wiring members molded inside said mounting member and connecting a solenoid of the solenoid valve to said electric connector.

2. The solenoid valve mounting assembly of claim 1, wherein said mounting member is made of insulating resinous material with said wiring member integrally buried therein simultaneously when molding the mounting member, outwardly projecting plug terminals are provided on the solenoid valve, and said plug terminals are inserted into inserting holes formed in said mounting member and come in contact with said wiring members for being electrically connected thereto upon the solenoid valve being mounted on said mounting member.

3. The solenoid valve mounting assembly of claim 1, wherein said mounting member is formed of an insulating resinous material, a plurality of vertically penetrating bolt inserting holes are formed in said mounting member, said mounting member being fixed to the base member with setting bolts each inserted through a bolt inserting hole and screwed into a screw hole formed in the base member, a metallic cylindrical collar member mounted in each bolt inserting hole, and at least a portion of the tightening force of each said setting bolt being received by said collar member.

4. The solenoid valve mounting assembly of claim 1, wherein the solenoid valve comprises a three-way valve having an inlet path, an outlet path, and a drain path, a drain path being provided in said mounting member, the drain path of the mounting member has an opening on a bottom surface of said mounting member, and a base member drain path formed in the base member facing the opening of the drain path of said mounting member when said mounting member is mounted on the base member.

5. A solenoid valve mounting assembly for mounting a solenoid valve on a base member having a supplied oil path and a discharged oil path for the solenoid valve to control communication between those two oil paths, comprising, a mounting member having an opening therethrough and a bottom surface for mounting on the base member to cover the supplied oil path and the discharged oil path, the solenoid valve being mounted on said mounting member over said opening and having an inlet port member extending through said opening and beyond said bottom surface, said inlet port member extending into the supplied oil path in sealing engagement with the base member and having an inlet port communicating with the supplied oil path, the solenoid valve having an outlet port communicating with the discharged oil path via a communicating groove formed on said bottom surface of said mounting member when the solenoid valve is mounted on the mounting member, said mounting member being molded of an insulating material, and at least two uninsulated wires molded internally within said mounting member in spaced relationship and connecting a solenoid of the solenoid valve to an external electrical connector mounted on said mounting member.

6. The solenoid valve mounting assembly of claim 5, wherein said mounting member is formed of an insulating resinous material and a wiring member for the solenoid valve is monolithically built-in said mounting member.

* * * * *